(12) United States Patent
Wang et al.

(10) Patent No.: US 6,245,610 B1
(45) Date of Patent: Jun. 12, 2001

(54) METHOD OF PROTECTING A WELL AT A FLOATING STAGE

(75) Inventors: Mu-Chun Wang, Hsinchu Hsien; Tzung-Han Lee, Taipei; Shiang Huang-Lu, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/406,517

(22) Filed: Sep. 28, 1999

(51) Int. Cl.⁷ .................................................. H01L 21/8234
(52) U.S. Cl. ............................................. 438/237; 438/328
(58) Field of Search ................................. 438/237, 200, 438/210, 215, 232, 328, 414

(56) References Cited

U.S. PATENT DOCUMENTS

| | | | | |
|---|---|---|---|---|
| 3,789,503 | * | 2/1974 | Nishida et al. | 438/237 |
| 4,072,975 | * | 2/1978 | Ishitani | 438/237 |
| 4,119,440 | * | 10/1978 | Hile | 438/237 |
| 5,338,693 | * | 8/1994 | Kinzer et al. | 438/237 |
| 5,661,069 | * | 8/1997 | Owens et al. | 438/237 |
| 5,889,293 | * | 3/1999 | Rutten et al. | 257/74 |
| 6,034,433 | * | 3/2000 | Beatty | 257/758 |
| 6,046,079 | * | 4/2000 | Ko et al. | 438/237 |
| 6,071,803 | * | 6/2000 | Rutten et al. | 438/618 |
| 6,097,045 | * | 8/2000 | Min | 257/233 |
| 6,104,021 | * | 8/2000 | Ogawa | 438/237 |
| 6,110,841 | * | 8/2000 | Wang et al. | 438/766 |
| 6,117,714 | * | 9/2000 | Beatty | 438/196 |
| 6,177,298 | * | 1/2001 | Quigley | 438/237 |

* cited by examiner

*Primary Examiner*—John F. Niebling
*Assistant Examiner*—Lynne A. Gurley
(74) *Attorney, Agent, or Firm*—Thomas, Kayden, Horstemeyer & Risley

(57) ABSTRACT

A method of protecting a well at a floating stage. In a first conductive type substrate, a second conductive type well is formed. A first conductive type heavily doped region and a second conductive type heavily doped region are respectively formed in the first conductive type substrate and the second conductive type well. These two heavily doped regions are electrically connected with each at an early stage of fabrication process to provide a protection from being damaged during subsequent plasma process or other processes. While forming a top metal layer of a multi-level interconnect, these two heavily doped regions are disconnected, that is, open to each other, to obtain a better electrical characteristic of the device or the integrated circuit formed on the substrate.

14 Claims, 3 Drawing Sheets

METHOD OF PROTECTING A WELL AT A FLOATING STAGE

BACKGROUND OF THE INVENTION

1. Field of the Invention

The invention relates in general to an N-well or a P-well at a floating stage. More particularly, the invention relates to a method of protecting an N-well or P-well at a floating stage from being damaged by plasma without degrading electrical characteristics or performance.

2. Description of the Related Art

In an integrated circuit, after the formation of certain devices, there are still some processes to be performed to complete the circuit layout. For example, after a PMOS or an NMOS is formed on a substrate, to obtain an electrical connection between PMOS or NMOS and other devices or terminals, a conductive layer is formed and patterned. While patterning the conductive layer, an etching step is inevitable. The plasma or other charged particles used to etch the conductive layer very often damage the NMOS or PMOS formed on the substrate.

Similarly, for a substrate comprising a floating well having a conductivity type different from that of the substrate, that is, the well at a floating stage without electrically connecting to other component or device, the above mentioned plasma damage is also very likely to happen.

Considering a P type substrate comprises an N-well therein. The P type substrate is typically placed on or connected to a chuck which is grounded. Therefore, any charged carriers coming from the plasma can be directed to the chuck to be grounded via the P type substrate. However, if the charged carriers are absorbed by the N-well, these carriers have no path to dissipate or to be neutralized. As a result, the charged carriers accumulate in the N-well, and thus, the electrical characteristics of the N-well or even the quality of gate oxide formed thereon is seriously degraded.

In addition, since the N-well is formed in and adjacent to the P type substrate, plus that the P type substrate is grounded, a potential difference is caused between the P-type substrate and the N-well. Therefore, if a protection structure across the N-well and the P type substrate is formed to resolve the problems caused by plasma damage, with this potential difference, the performance and electrical characteristics will be degraded.

SUMMARY OF THE INVENTION

The method provides a method which uses a big via pattern plus an over etching step for a top metal layer formed for interconnect. As a result, the originally connected components in a first conductive type substrate and in the second conductive type well formed for the purpose of protection from plasma damage is open while the top metal layer is patterned. Therefore, during the fabrication process, the second type well is not damaged while the electrical properties of the devices or circuit is enhanced. The gate oxide layers formed on both the first conductive type substrate and the second type well thus maintain similar good quality.

A method of protecting a floating well is provided in the invention. In a substrate of a first conductive type, a second conductive type well is formed. A first heavily doped region of the first conductive type and a second heavily doped region of the second conductive type are formed in the substrate and the well, respectively. A first dielectric layer is formed on the substrate and the well. Within the dielectric layer, there are at least two plugs to couple with the first and the second heavily doped region respectively. These two plugs are further electrically connected with each other by the formation of a bottom metal layer within the dielectric layer. The dielectric layer is patterned to formed first via hole or contact window openings with various sizes, and one of the first openings is formed to align over and expose the first metal layer. A glue layer is formed on the dielectric layer, so that a portion of the first openings with sizes large enough have the glue layer conformal thereto, while the other portion of the first openings with sizes small enough are filled with the glue layer. A chemical mechanical polishing step is performed to remove the glue layer on a top surface of the first dielectric layer as well as the glue layer on the portion of the first openings which are substantially large enough, such as the first opening exposing the first metal layer. Therefore, the first metal layer is exposed. A second dielectric layer is formed and patterned on the first dielectric layer. The second dielectric layer has second openings with various sizes, while one of the second openings exposes the first metal layer. A glue layer is formed on the second dielectric layer and surfaces of the second openings. Again, while a portion of the second openings has substantially small sizes, the portion of the second openings is filled thereby. A second metal layer is formed and patterned on the second dielectric layer. The second metal layer is further over etched until the first metal layer under a bottom of one of the second openings that aligned over the first metal layer is open.

Both the foregoing general description and the following detailed description are exemplary and explanatory only and are not restrictive of the invention, as claimed.

DESCRIPTION OF THE PREFERRED EMBODIMENTS

Figure 1A:
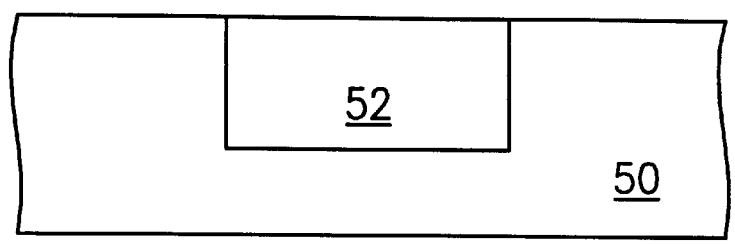
FIG. 1A to FIG. 1G shows a method for protecting an N-well from being damaged by plasma according to the invention.
Figure 1B:
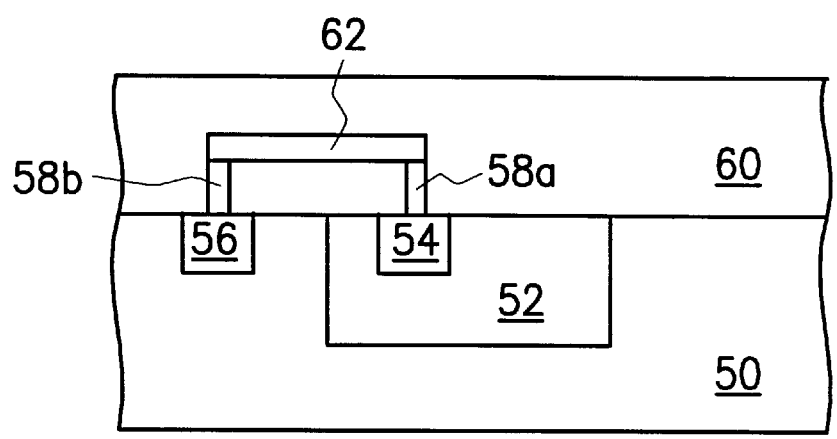
Figure 1C:
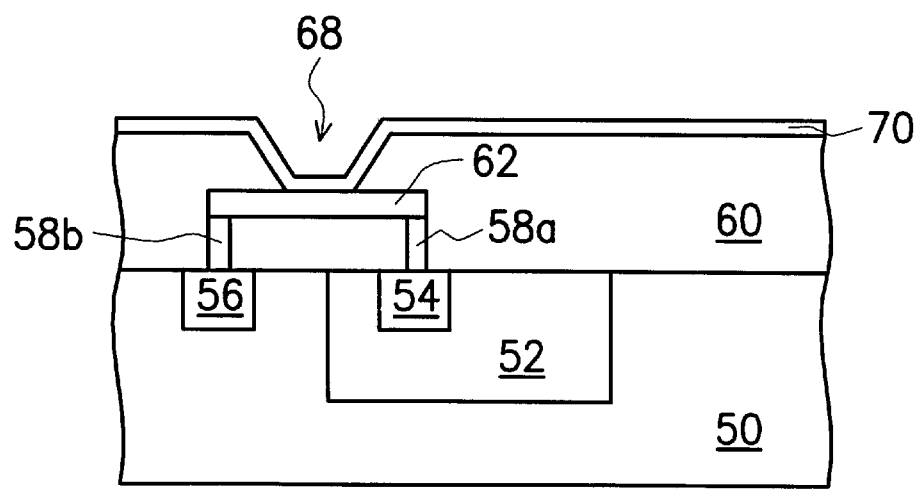
Figure 2:
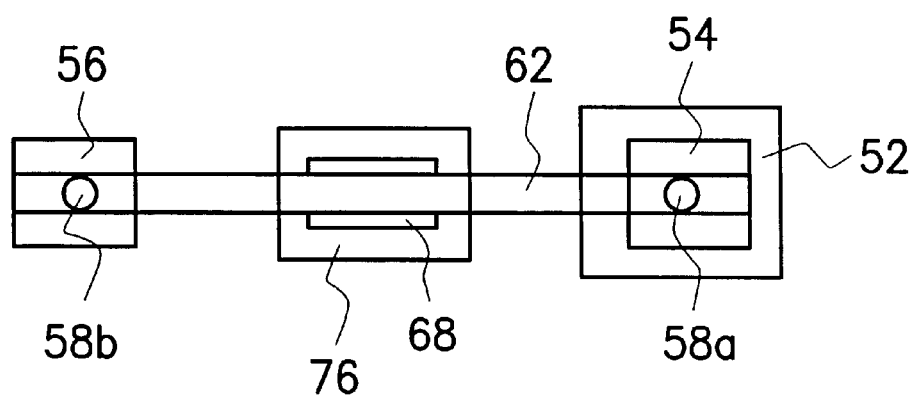
FIG. 2 shows a top view of the protection structure of an N-well.

FIG. 1A to FIG. 1C are cross sectional views showing a protection structure and a method to fabricating the protection structure for an N-well formed in a P type substrate. FIG. 2 shows a top view of the protection structure. It is appreciated that people skilled in the art may interchange the conductive types of the well and the substrate to fabricate a protection structure for P-well using the method disclosed in the invention.

Referring to FIG. 1A, a substrate 50 is provided. The substrate 50 is P type lightly doped region. An N-well 52 is formed in the substrate 50. The invention can also employs an N type lightly doped region comprising a P-well, while the elements or devices formed subsequently has to interchange the polarity. A protection structure of a P-well can thus be formed in the same manner as to be mentioned as follows.

Referring to FIG. 1B, an N type heavily doped region, namely, N+ region 54 hereinafter, is formed in the N-well 52. A P-type heavily doped region, namely, P+ region 52. A P-type heavily doped region, namely, P+ region is formed in the P-type substrate 50. A dielectric layer 60 is formed to cover the substrate 50 and the N-well 52. Plugs 58a, 58b are formed in the dielectric layer 60 to respectively couple with the N+ region 54 and P+ region 56. A metal layer 62, typically a bottom metal layer, is formed in the dielectric layer 60 to couple with both the plugs 58a and 58b.

Thus, the P+ region 56 in the P type substrate 50 is electrically connected with the N+ region in the N-well. While putting the substrate 50 into a plasma environment, even the environment is full of charged particles, these charged carriers are directed along the connection towards the chuck to be grounded. Therefore, if a gate oxide layer is formed on the substrate 50, or the N-well 52, the quality is not to be damaged subject to any plasma damage.

However, as mentioned above, the P type substrate 50 and the N-well has a PN junction. The P type substrate 50 is grounded while the N-well 52 is at a floating stage, there exists a potential difference which causes degradation of circuit performance.

Referring to FIG. 1C, using photolithography and etching step, a part of the dielectric layer 60 is removed to form at least one opening exposing the metal layer 52. Preferably, via hole or contact window openings with various sizes are formed within the dielectric layer 60. In FIG. 1C, one of the openings 68 exposing the metal layer 62 is shown, while the rest of the openings are not shown in the figure. A glue layer 70 is formed on the dielectric layer 60 and on an inner surface of the opening 68, while other openings with smaller sizes might be filled with the glue layer 70. The glue layer 70 is preferably a metal layer such as a tungsten layer. Basically, the glue layer 70 is very thin to be conformal to a surface profile of the substrate 50.

Figure 1D:
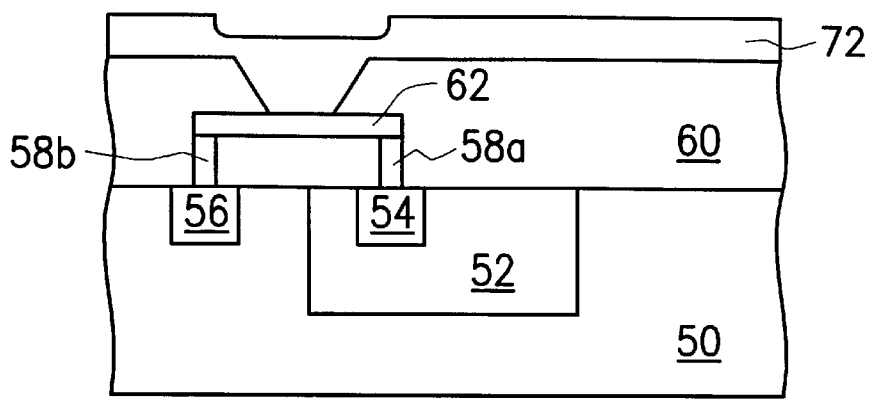
Figure 1E:
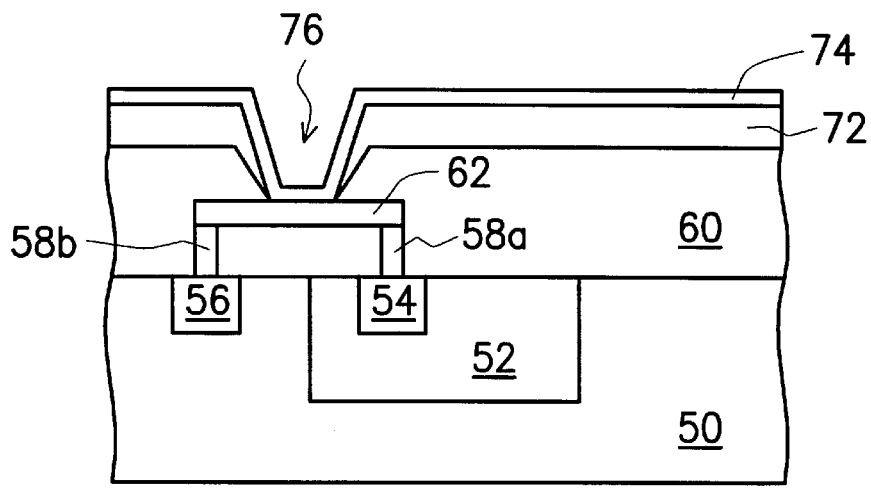

In FIG. 1D, using chemical mechanical polishing, the glue layer 70 on the dielectric layer 60 and on surfaces of those openings with sizes large enough such as the opening 68 is removed. A dielectric layer 72 is formed on the dielectric layer 60 to fill the openings including the opening 68. The dielectric layer 72 is patterned to form openings with various sizes. One of the openings aligned over to expose the metal layer 62 is denoted as a reference numeral 76. A glue layer 74 is formed on the dielectric layer 72 and surfaces of the openings. Again, for those openings with a small size, the openings are filled with the glue layer 74. In contrast, for those openings with a size large enough, the glue layer 74 is formed along a surface profile of the openings such as the opening 76. The glue layer 74 is preferably thin to be conformal to the opening 76.

Figure 1F:
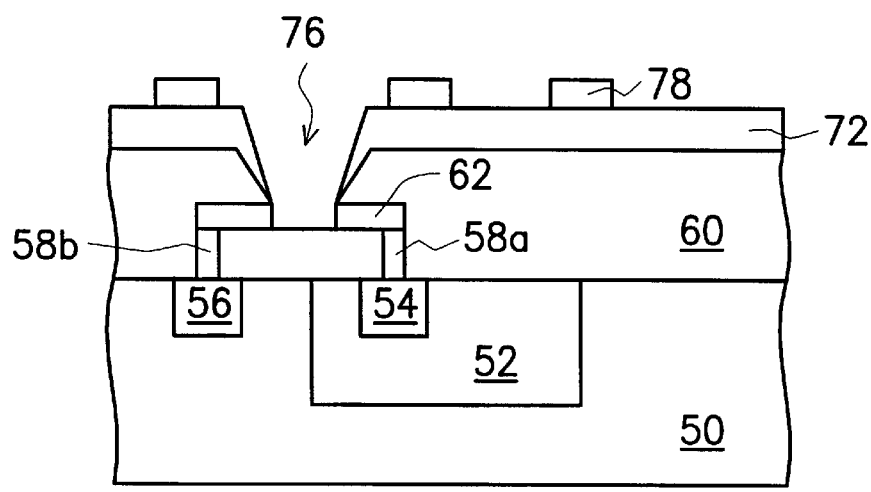
Figure 1G:
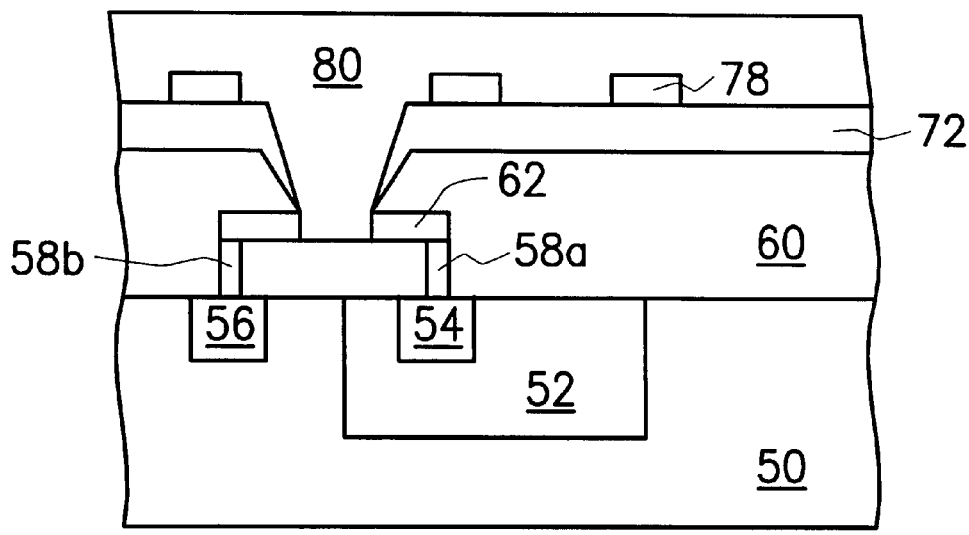

In FIG. 1F, a metal layer 78 is formed and patterned on the dielectric layer 72. In this embodiment, the metal layer 78 is used as a top metal layer for multi-level interconnection. After patterning the metal layer 78, an over etch step is performed until the glue layer 74 is removed to expose the metal layer 62, and the metal layer 62 exposed by the opening 76 is further removed. As a result, the metal layer 62 is broken into two separate sections without connecting with each other. Therefore, the electrical connection between the N+ region 54 in the N-well 52 and the P+ region 56 in substrate 50 is open. A top view of the resultant protection structure can be referred to FIG. 2.

After the top metal layer 78 is formed and the metal layer 62 is open, it is very often that a passivation layer 80 is formed to protecting the surface device and component from being damaged or scratched. The passivation layer 80 also provides a way for release any external mechanical or force or damage.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of protecting a second conductive type well at a floating stage formed in a first conductive type substrate, comprising:

forming a first conductive type heavily doped region in the first conductive type substrate, and a second conductive type heavily doped region in the second conductive type well;

forming a first dielectric layer to cover the first conductive type substrate including the second conductive type well, wherein the first dielectric layer comprises a first and a second plug coupled to the first heavily doped region and the second heavily doped region, respectively, and a first metal layer is formed in the first dielectric layer and coupled to both the first and the second plugs;

removing a portion of the first dielectric layer to form at least a first opening which exposes the first metal layer;

forming a second dielectric layer to cover the first dielectric layer and to fill the first opening;

removing a portion of the second dielectric layer to form at least a second opening which exposes the metal layer;

forming a glue layer along a surface profile of the substrate;

forming and patterning a second metal layer on the second dielectric layer; and performing an over etching step until the glue layer exposed by the second metal layer and the first metal layer under a bottom of the second opening are removed.

2. The method according to claim 1, wherein first conductive type is P type and the second conductive type is N type.

3. The method according to claim 1, wherein the first conductive type is N type and the second conductive type is P type.

4. The method according to claim 1, comprising further the steps of:

forming a glue layer along a surface profile of the substrate before forming the second dielectric layer; and performing a chemical mechanical polishing step.

5. The method according to claim 1, wherein the glue layer includes a tungsten layer.

6. The method according to claim 1, comprising further a step of forming a passivation layer after the step of over etching.

7. A method of protecting a well at a wafer stage, comprising:

providing a substrate of a first conductive type;

forming the well of a second conductive type in the substrate;

forming a first heavily doped region of the first conductive type in the substrate;

forming a second heavily doped region of the second conductive type in the well;

forming a first dielectric layer on the substrate, the first dielectric layer comprising a first metal layer electrically connecting the first and the second heavily doped region;

etching the first dielectric layer to form a plurality of first openings, wherein one of the first openings exposes the first metal layer;

forming a first glue layer on the first dielectric layer, wherein a first portion of the first openings with sizes small enough are full of the first glue layer, while the second portion of the first openings including the first opening exposing the first metal layer with sizes substantially large have the first glue cover inner surfaces thereof;

etching the first glue layer so that the first dielectric layer, the inner surfaces of the other portion of the first openings and the first metal layer are exposed;

forming a second dielectric layer on the first dielectric layer and the first metal layer;

etching the second dielectric layer to form a plurality of second openings, while one of the second openings exposing the first metal layer;

forming and patterning a second metal layer over the second dielectric layer; and performing an over etching step to remove a part of the first metal layer.

8. The method according to claim 7, wherein the first conductive type is P type and the second conductive type is N type.

9. The method according to claim 7, wherein the first conductive type is N type and the second conductive type is P type.

10. The method according to claim 7, comprising further a step of forming a passivation layer on the second metal layer.

11. A method of protecting a well of a second conductive type formed in a substrate of a first conductive type, the method comprising:

forming a first heavily doped region of the first conductive type in the substrate;

forming a second heavily doped region of the second conductive type in the well;

forming a dielectric layer on the substrate;

forming a bottom metal layer to electrically connect the first and the second heavily doped regions; and forming a multi-level interconnect including a top metal layer on the dielectric layer, and breaking the bottom metal layer into two separate sections while patterning the top metal layer.

12. The method according to claim 11, wherein the first conductive type is P type and the second conductive type is N type.

13. The method according to claim 11, wherein the first conductive type is N type and the second conductive type is P type.

14. The method according to claim 11, comprising further a step of forming a passivation layer on the multi-level interconnect.

* * * * *